United States Patent
David et al.

(10) Patent No.: US 9,908,772 B2
(45) Date of Patent: *Mar. 6, 2018

(54) NANOSTRUCTURED ARTICLES AND METHODS OF MAKING NANOSTRUCTURED ARTICLES

(75) Inventors: Moses M. David, Woodbury, MN (US); Andrew K. Hartzell, Hudson, WI (US); Timothy J. Hebrink, Scandia, MN (US); Ta-Hua Yu, Woodbury, MN (US); Jun-Ying Zhang, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 613 days.

This patent is subject to a terminal disclaimer.

(21) Appl. No.: 13/141,420

(22) PCT Filed: Dec. 18, 2009

(86) PCT No.: PCT/US2009/068657
§ 371 (c)(1),
(2), (4) Date: Jun. 22, 2011

(87) PCT Pub. No.: WO2010/123528
PCT Pub. Date: Oct. 28, 2010

(65) Prior Publication Data
US 2011/0281068 A1    Nov. 17, 2011

Related U.S. Application Data

(60) Provisional application No. 61/141,517, filed on Dec. 30, 2008.

(51) Int. Cl.
*C23F 1/00*     (2006.01)
*B82Y 30/00*    (2011.01)
(Continued)

(52) U.S. Cl.
CPC .......... *B81C 1/00031* (2013.01); *G02B 1/118* (2013.01); *B81B 2201/047* (2013.01);
(Continued)

(58) Field of Classification Search
CPC .. B32B 3/00; G02B 1/11; G02B 1/118; H01L 31/02366
(Continued)

(56) References Cited

U.S. PATENT DOCUMENTS 4,374,158 A    2/1983   Taniguchi et al.
5,104,929 A    4/1992   Bilkadi
(Continued)

FOREIGN PATENT DOCUMENTS

EP    1 416 303     5/2004
EP    2005-11021    1/2005
(Continued)

OTHER PUBLICATIONS

Expose. 2015. Merriam-Webster.com. Retrieved Nov. 24, 2015, from http://www.merriam-webster.com/dictionary/expose.*
(Continued)

*Primary Examiner* — Laura A Auer
(74) *Attorney, Agent, or Firm* — Clifton F. Richardson; Yen Tong Florczak; Gregory D. Allen

(57) ABSTRACT

A nanostructured article comprises a matrix and a nanoscale dispersed phase. The nanostructured article has a random nanostructured anisotropic surface.

14 Claims, 4 Drawing Sheets

(51) Int. Cl.
*B82Y 40/00* (2011.01)
*B81C 1/00* (2006.01)
*G02B 1/118* (2015.01)

(52) U.S. Cl.
CPC ............ *B81B 2203/0361* (2013.01); *Y10T 428/24355* (2015.01)

(58) Field of Classification Search
USPC ...................................................... 428/141
See application file for complete search history.

(56) References Cited

U.S. PATENT DOCUMENTS

| | | | |
|---|---|---|---|
| 5,300,189 A | 4/1994 | Kokaku et al. | |
| 5,304,279 A | 4/1994 | Coultas et al. | |
| 5,888,594 A | 3/1999 | David et al. | |
| 5,909,314 A | 6/1999 | Oka | |
| 5,948,166 A | 9/1999 | David | |
| 6,064,524 A | 5/2000 | Oka | |
| 6,340,404 B1 | 1/2002 | Oka et al. | |
| 6,359,735 B1 | 3/2002 | Gombert et al. | |
| 6,372,829 B1 | 4/2002 | Lamanna et al. | |
| 6,376,590 B2 | 4/2002 | Kolb et al. | |
| 6,483,635 B1 | 11/2002 | Wach | |
| 6,565,763 B1 | 5/2003 | Asakawa | |
| 6,861,121 B2 | 3/2005 | Matsunaga | |
| 6,890,448 B2 | 5/2005 | Pavelchek | |
| 7,030,008 B2 | 4/2006 | Allen et al. | |
| 7,091,281 B2 | 8/2006 | Kageishi et al. | |
| 7,241,437 B2 | 7/2007 | Davidson et al. | |
| 7,332,213 B2 | 2/2008 | Mimura et al. | |
| 7,368,161 B2 | 5/2008 | McGurran et al. | |
| 7,378,136 B2 | 5/2008 | Pokorny et al. | |
| 7,604,381 B2 | 10/2009 | Hebrink et al. | |
| 7,850,319 B2 | 12/2010 | Yoshikawa | |
| 8,202,582 B2 | 6/2012 | Shinotsuka | |
| 8,226,837 B2 | 7/2012 | Kurihara | |
| 8,298,649 B2 | 10/2012 | Reyssat | |
| 8,361,339 B2 | 1/2013 | Nakanishi | |
| 8,593,603 B2 | 11/2013 | Egi et al. | |
| 8,840,258 B2 | 9/2014 | Nakanishi | |
| 2003/0139620 A1* | 7/2003 | Yamaguchi et al. | 556/445 |
| 2003/0180476 A1 | 9/2003 | Yamashita | |
| 2003/0222048 A1 | 12/2003 | Asakawa | |
| 2004/0050816 A1 | 3/2004 | Asakawa | |
| 2004/0071937 A1 | 4/2004 | Chien | |
| 2004/0095658 A1 | 5/2004 | Buretea | |
| 2004/0125266 A1* | 7/2004 | Miyauchi et al. | 349/57 |
| 2005/0095699 A1 | 5/2005 | Miyauchi | |
| 2005/0233083 A1 | 10/2005 | Schulz et al. | |
| 2006/0024018 A1 | 2/2006 | Piehl et al. | |
| 2006/0134400 A1 | 6/2006 | Takada et al. | |
| 2006/0147674 A1 | 7/2006 | Walker, Jr. et al. | |
| 2006/0231525 A1 | 10/2006 | Asakawa | |
| 2007/0031639 A1* | 2/2007 | Hsu et al. | 428/141 |
| 2007/0047087 A1 | 3/2007 | Fukuda | |
| 2007/0065638 A1 | 3/2007 | Wang | |
| 2007/0104922 A1 | 5/2007 | Zhai | |
| 2007/0118939 A1 | 5/2007 | Repetto et al. | |
| 2007/0141329 A1 | 6/2007 | Yang et al. | |
| 2007/0166513 A1* | 7/2007 | Sheng et al. | 428/141 |
| 2007/0195431 A1 | 8/2007 | Asakura et al. | |
| 2007/0268587 A1 | 11/2007 | Ninomiya et al. | |
| 2008/0050560 A1 | 2/2008 | Jones et al. | |
| 2008/0135089 A1 | 6/2008 | Tsakalakos | |
| 2008/0160257 A1 | 7/2008 | Takada | |
| 2008/0174875 A1 | 7/2008 | Iwata et al. | |
| 2008/0259455 A1* | 10/2008 | Stuck et al. | 359/568 |
| 2008/0286527 A1 | 11/2008 | Haga et al. | |
| 2008/0292866 A1 | 11/2008 | Shinohara | |
| 2009/0087629 A1 | 4/2009 | Everaerts et al. | |
| 2009/0130380 A1 | 5/2009 | Asakawa | |
| 2009/0261063 A1 | 10/2009 | Munzert et al. | |
| 2009/0305012 A1* | 12/2009 | Song | 428/328 |
| 2009/0316060 A1 | 12/2009 | Nirmal et al. | |
| 2010/0028564 A1 | 2/2010 | Cheng et al. | |
| 2010/0165276 A1 | 7/2010 | David | |
| 2010/0221513 A1* | 9/2010 | Anderson | C03C 17/23 428/216 |
| 2011/0051246 A1 | 3/2011 | Schulz et al. | |
| 2012/0037594 A1 | 2/2012 | Asakawa | |
| 2012/0037595 A1 | 2/2012 | Asakawa | |
| 2012/0041121 A1 | 2/2012 | Asakawa | |
| 2012/0300305 A1 | 11/2012 | Kurihara | |

FOREIGN PATENT DOCUMENTS

| | | |
|---|---|---|
| JP | 07104103 | 4/1995 |
| JP | 10-301105 | 11/1998 |
| JP | 2001-163906 | 6/2001 |
| JP | 2002-122702 | 4/2002 |
| JP | 2002-261261 | 9/2002 |
| JP | 2002286906 | 10/2002 |
| JP | 2003-129008 | 5/2003 |
| JP | 2005099707 | 4/2005 |
| JP | 2005-331910 | 12/2005 |
| JP | 2007-193323 | 8/2007 |
| JP | 2008-299346 | 12/2008 |
| KR | 10-0696399 | 3/2007 |
| KR | 10-0810203 | 3/2008 |
| WO | WO 99/36262 | 7/1999 |
| WO | WO 2004/024805 A1 | 3/2004 |
| WO | WO 2004/0606946 | 7/2004 |
| WO | WO 2004/104113 | 12/2004 |
| WO | WO 2007/073007 | 6/2007 |
| WO | WO 2008/051284 | 5/2008 |
| WO | WO 2008/069848 | 6/2008 |
| WO | WO 2008/128073 | 10/2008 |
| WO | WO 2009/089137 | 7/2009 |
| WO | WO 2010/078071 | 7/2010 |
| WO | WO 2010/078306 A2 | 7/2010 |

OTHER PUBLICATIONS

Burmeister et al., "Applications for TiAlN- and TiO$_2$-coatings with nanoscale surface topographies", *Surface & Coatings Technology*, 200, (2005), pp. 1555-1559.

Burmeister et al., "Investigation of structured TiAlN- and TiO2-coatings with moth-eye-like surface morphologies", *Surface & Coatings Technology*, 200, (2005), pp. 1088-1092.

Yoshida et al., "Antireflection Structure of Self-Organized GaN Nanotips", Optoelectronic and Microelectronic Materials and Devices Conference, IEEE, Dec. 2002, pp. 79-82.

Yu et al., "Fabrication of large area subwavelength antireflection structures on Si using trilayer resist nanoimprint lithography and liftoff", *Journal of Vacuum Science & Technology B*, 21(6), Nov./Dec. 2003, pp. 2874-2877.

Zaidi et al., "Characterization of Random Reactive Ion Etched-Textured Silicon Solar Cells", *IEEE Transactions on Electron Devices*, vol. 48, No. 6, Jun. 2001, pp. 1200-1206.

Sun et al., "Large-scale assembly of periodic nanostructures with metastable square lattices", *J. Vac. Sci. Technol. B*, 27(3), May/Jun. 2009, pp. 1043-1047.

Blaisi, "Antireflection with Moth-Eye Structures: Injection Moulding of Functional Microstructured Surfaces", Plast. Europe, pp. 15-18, Translated from Kunststoffe, 2002, vol. 92, No. 5, pp. 50-53 (4 pages).

* cited by examiner

NANOSTRUCTURED ARTICLES AND METHODS OF MAKING NANOSTRUCTURED ARTICLES

CROSS REFERENCE TO RELATED APPLICATIONS

This application is a national stage filing under 35 U.S.C. 371 of PCT/US2009/068657 filed Dec. 18, 2009, which claims the benefit of Provisional Application No. 61/141,517 filed Dec. 30, 2008.

FIELD

This invention relates to nanostructured articles that are useful, for example, as antireflective articles. In another aspect, this invention relates to methods for making nanostructured articles.

BACKGROUND

Whenever light travels from one medium to another, some portion of the light is reflected from the interface between the two media. For example, about 4-5% of the light shining on a clear plastic substrate is reflected at the top surface.

Different approaches have been employed to reduce the reflection of polymeric materials. One approach is to use antireflective (AR) coatings such as multilayer reflective coatings consisting of transparent thin film structures with alternating layers of contrasting refractive index to reduce reflection. It has proven difficult to achieve broadband antireflection using AR coatings, however.

Another approach involves using subwavelength surface structure (for example, subwavelength scale surface gratings) for broadband antireflection. The methods for creating the subwavelength surface structure tend to be complicated and expensive batch processes, however. For example, the method disclosed in U.S. Patent Application Pub. No. 2005/0233083 involves bombarding a polymeric surface with $Ar/O_2$ plasma under vacuum conditions of less than 0.5 mTorr. This requirement of extreme vacuum conditions limits the commercial viability of the method.

SUMMARY

In view of the foregoing, we recognize that there is a need for alternative approaches for reducing the reflection of surfaces, particularly polymeric surfaces. Furthermore, we recognize that in order for an approach for reducing the reflection of surfaces to commercially viable, it needs to be relatively simple and inexpensive.

Briefly, in one aspect, the present invention provides a nanostructured article comprising a matrix and a nanoscale dispersed phase, and having a random nanostructured anisotropic surface.

As used herein, "nanoscale" means submicron (for example, between about 1 nm and about 500 nm); "nanostructured" means having one dimension on the nanoscale; and "anisotropic surface" means a surface having structural asperities having a height to width (that is, average width) ratio of about 1.5:1 or greater (preferably, 2:1 or greater; more preferably, 5:1 or greater).

The nanostructured articles of the invention exhibit a significant reduction in reflectance compared to an unstructured article comprising the same matrix material and nanodispersed phase. In addition, the nanostructured articles of the invention can be durable and possess scratch resistance.

Some embodiments of the nanostructured articles of the invention also exhibit additional desirable properties such as, for example, antifogging, easy cleaning, antimicrobial activity, hydrophilicity, or hydrophobicity.

In another aspect, the present invention provides methods of making random nanostructured surfaces. One method comprises providing a matrix comprising a nanodispersed phase, and anisotropically etching the matrix using plasma to form a random nanostructured anisotropic surface. Another method comprises providing a matrix comprising a nanodispersed phase, and etching at least a portion of the nanodispersed phase using plasma to form a random nanostructured surface.

As used herein, "plasma" means a partially ionized gaseous or fluid state of matter containing electrons, ions, neutral molecules, and free radicals.

The methods of the invention can be carried out at moderate vacuum conditions (for example, between about 5 mTorr and about 10 mTorr). They can also be carried out as a roll-to-roll (that is, continuous) process using cylindrical reactive ion etching (cylindrical RIE).

The present invention therefore meets the need in the art for AR surfaces that are relatively simple and inexpensive to produce.

DETAILED DESCRIPTION

Figure 1:
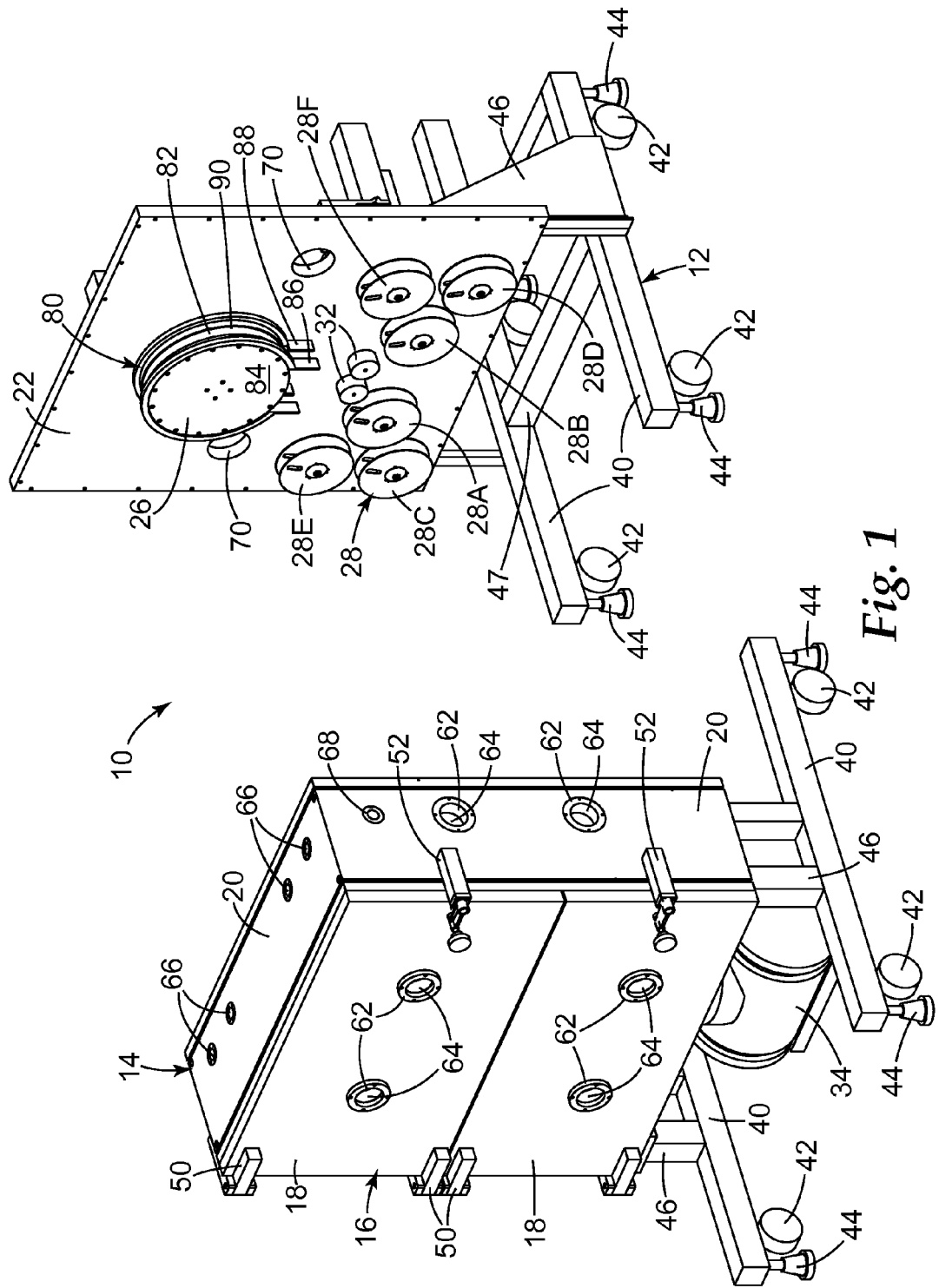
FIG. 1 is a first fragmentary perspective view of a coating apparatus useful in the present invention.

The nanostructured articles comprise a matrix with a dispersed phase. The matrix, or continuous phase, can comprise polymeric material, inorganic material, or alloys or solid solutions (including miscible polymers).

Useful polymeric materials include thermoplastics and thermosetting plastics. Suitable thermoplastics include, but are not limited to, polyethylene terephthalate (PET), polystyrene, acrylonitrile butadiene styrene, polyvinyl chloride, polyvinylidene chloride, polycarbonate, polyacrylates, thermoplastic polyurethanes, polyvinyl acetate, polyamide, polyimide, polypropylene, polyester, polyethylene, poly(m-ethylmethacrylate), polyethylene naphthalate, styrene acrylonitrile, silicone-polyoxamide polymers, fluoropolymers, cyclic olefin copolymers, thermoplastic elastomers, and the like.

Suitable thermosets include, but are not limited to, allyl resin, epoxies, thermosetting polyurethanes, silicones or polysiloxanes, and the like. These resins can be formed from the reaction product of polymerizable compositions comprising at least one oligomeric urethane (meth)acrylate. Typically the oligomeric urethane (meth)acrylate is multi (meth)acrylate. The term "(meth)acrylate" is used to designate esters of acrylic and methacrylic acids, and "multi (meth)acrylate" designates a molecule containing more than one (meth)acrylate group, as opposed to "poly(meth)acrylate" which commonly designates (meth)acrylate polymers. Most often, the multi(meth)acrylate is a di(meth)acrylate, but it is also contemplated to employ tri(meth)acrylates, tetra(meth)acrylates and so on.

Oligomeric urethane multi(meth)acrylates may be obtained commercially, for example from Sartomer under the trade designation "Photomer 6000 Series", such as "Photomer 6010" and "Photomer 6020", and also under the trade designation "CN 900 Series", such as "CN966B85", "CN964" and "CN972". Oligomeric urethane (meth)acrylates are also available from Surface Specialties, such as available under the trade designations "Ebecryl 8402", "Ebecryl 8807" and "Ebecryl 4827". Oligomeric urethane (meth)acrylates may also be prepared by the initial reaction of an alkylene or aromatic diisocyanate of the formula OCN—R3-NCO with a polyol. Most often, the polyol is a diol of the formula HO—R4-OH wherein R3 is a C2-100 alkylene or an arylene group and R4 is a C2-100 alkylene group. The intermediate product is then a urethane diol diisocyanate, which subsequently can undergo reaction with a hydroxyalkyl (meth)acrylate. Suitable diisocyanates include 2,2,4-trimethylhexylene diisocyanate and toluene diisocyanate. Alkylene diisocyanates are generally preferred. A particularly preferred compound of this type may be prepared from 2,2,4-trimethylhexylene diisocyanate, poly(caprolactone)diol and 2-hydroxyethyl methacrylate. In at least some cases, the urethane (meth)acrylate is preferably aliphatic.

The polymerizable resins can be radiation curable compositions comprising at least one other monomer (that is, other than an oligomeric urethane (meth)acrylate). The other monomer may reduce viscosity and/or improve thermomechanical properties and/or increase refractive index. Monomers having these properties include acrylic monomers (that is, acrylate and methacrylate esters, acrylamides and methacrylamides), styrene monomers and ethylenically unsaturated nitrogen heterocycles.

Suitable acrylic monomers include monomeric (meth)acrylate esters. They include alkyl (meth)acrylates such as methyl acrylate, ethyl acrylate, 1-propyl acrylate, methyl methacrylate and t-butyl acrylate.

Also included are (meth)acrylate esters having other functionality. Compounds of this type are illustrated by the 2-(N-butylcarbamyl)ethyl (meth)acrylates, 2,4-dichlorophenyl acrylate, 2,4,6-tribromophenyl acrylate, tribromophenoxylethyl acrylate, t-butylphenyl acrylate, phenyl acrylate, phenyl thioacrylate, phenylthioethyl acrylate, alkoxylated phenyl acrylate, isobornyl acrylate and phenoxyethyl acrylate. The reaction product of tetrabromobisphenol A diepoxide and (meth)acrylic acid is also suitable.

The other monomer may also be a monomeric N-substituted or N,N-disubstituted (meth)acrylamide, especially an acrylamide. These include N-alkylacrylamides and N,N-dialkylacrylamides, especially those containing C1-4 alkyl groups. Examples are N-isopropylacrylamide, N-t-butylacrylamide, N,N-dimethylacrylamide and N,N-diethylacrylamide.

The other monomer may further be a polyol multi(meth)acrylate. Such compounds are typically prepared from aliphatic diols, triols, and/or tetraols containing 2-10 carbon atoms. Examples of suitable poly(meth)acrylates are ethylene glycol diacrylate, 1,6-hexanediol diacrylate, 2-ethyl-2-hydroxymethyl-1,3-propanediol triacylate (trimethylolpropane triacrylate), di(trimethylolpropane) tetraacrylate, pentaerythritol tetraacrylate, the corresponding methacrylates and the (meth)acrylates of alkoxylated (usually ethoxylated) derivatives of said polyols. Monomers having two or more (ethylenically unsaturated groups can serve as a crosslinker.

Styrenic compounds suitable for use as the other monomer include styrene, dichlorostyrene, 2,4,6-trichlorostyrene, 2,4,6-tribromostyrene, 4-methylstyrene and 4-phenoxystyrene. Ethylenically unsaturated nitrogen heterocycles include N-vinylpyrrolidone and vinylpyridine.

Constituent proportions in the radiation curable materials can vary. In general, the organic component can comprise about 30-100% oligomeric urethane multi(meth)acrylate, with any balance being the other (meth)acrylate monomer ethylenically unsaturated groups.

Useful inorganic materials for the matrix include, for example, glasses, metals, metal oxides, and ceramics. Preferred inorganic materials include silicon oxide, zirconia, vanadium pentoxide, and tungsten carbide.

The nanoscale dispersed phase is a discontinuous phase randomly dispersed within the matrix. The nanoscale dispersed phase can comprise nanoparticles (for example, nanospheres), nanotubes, nanofibers, caged molecules, hyperbranched molecules, micelles, reverse micelles, or the like. Preferably, the dispersed phase comprises nanoparticles or caged molecules; more preferably, the dispersed phase comprises nanoparticles.

Nanoparticles preferably have a mean diameter in the range from about 1 nm to about 100 nm. Preferably, the nanoparticles have a mean diameter of 5 nm, 20 nm, or 80 nm. Nanoparticles for the dispersed phase can comprise metals, metal oxides, carbides, nitrides, borides, halides, fluorocarbon solids, or the like, or mixtures thereof. Preferred materials include $SiO_2$, $ZrO_2$, $TiO_2$, ZnO, calcium carbonate, magnesium silicate, indium tin oxide, antimony tin oxide, carbon, poly(tetrafluoroethylene), and the like. Preferably, the nanoparticles comprise $SiO_2$.

Nanoparticles can be present in the matrix in an amount from about 1% to about 60%, or about 10% to about 40% by weight. Silicas for use in the materials of the invention are commercially available from Nalco Chemical Co., Naperville, Ill. Under the trade designation "Nalco Colloidal Silicas" such as products 1040, 1042, 1050, 1060, 2327 and 2329. Suitable fumed silicas include for example, products commercially available from Evonik under the trade designation, "Aerosil series OX-50", as well as product numbers −130, −150, and −200. Other colloidal silica can be also obtained from Nissan Chemicals under the designations "IPA-ST", "IPA-ST-L", and "IPA-ST-ML". Fumed silicas are also commercially available from Cabot Corp., Tuscola, Ill., under the designations "CAB-O-SPERSE 2095", "CAB-O-SPERSE A105", and "CAB-O-SIL M5". Zirconias for use in composition and articles of the invention are available from Nalco Chemical Co. under the trade designation "Nalco OOSSOO8".

Surface-treating the nano-sized particles can provide a stable dispersion in the polymeric resin. Preferably, the surface-treatment stabilizes the nanoparticles so that the particles will be well dispersed in the polymerizable resin and result in a substantially homogeneous composition. Furthermore, the nanoparticles can be modified over at least a portion of its surface with a surface treatment agent so that the stabilized particles can copolymerize or react with the polymerizable resin during curing.

The nanoparticles are preferably treated with a surface treatment agent. In general, a surface treatment agent has a first end that will attach to the particle surface (covalently, ionically or through strong physisorption) and a second end that imparts compatibility of the particle with the resin and/or reacts with resin during curing. Examples of surface treatment agents include alcohols, amines, carboxylic acids, sulfonic acids, phosphonic acids, silanes and titanates. The preferred type of treatment agent is determined, in part, by the chemical nature of the metal oxide surface. Silanes are preferred for silica and other for siliceous fillers. Silanes and carboxylic acids are preferred for metal oxides such as zirconia. The surface modification can be done either subsequent to mixing with the monomers or after mixing. It is preferred in the case of silanes to react the silanes with the particles or nanoparticle surface before incorporation into the resins. The required amount of surface modifier is dependant on several factors such as particle size, particle type, molecular weight of the modifier, and modifier type.

Representative embodiments of surface treatment agents include compounds such as, for example, isooctyl trimethoxy-silane, N-(3-triethoxysilylpropyl)methoxyethoxyethoxyethyl carbamate (PEG3TES), N-(3-triethoxysilylpropyl)methoxyethoxyethoxyethyl carbamate (PEG2TES), 3-(methacryloyloxy)propyltrimethoxysilane, 3-acryloxypropyltrimethoxysilane, 3-(methacryloyloxy)propyltriethoxysilane, 3-(methacryloyloxy)propylmethyldimethoxysilane, 3-(acryloyloxypropyl)methyldimethoxysilane, 3-(methacryloyloxy)propyldimethylethoxysilane, vinyldimethylethoxysilane, pheyltrimethaoxysilane, n-octyltrimethoxysilane, dodecyltrimethoxysilane, octadecyltrimethoxysilane, propyltrimethoxysilane, hexyltrimethoxysilane, vinylmethyldiactoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltrisisobutoxysilane, vinyltriisopropenoxysilane, vinyltris(2-methoxyethoxy)silane, styrylethyltrimethoxysilane, mercaptopropyltrimethoxysilane, 3-glycidoxypropyltrimethoxysilane, acrylic acid, methacrylic acid, oleic acid, stearic acid, dodecanoic acid, 2-(2-(2-methoxyethoxy)ethoxy)acetic acid (MEEAA), beta-carboxyethylacrylate, 2-(2-methoxyethoxy)acetic acid, methoxyphenyl acetic acid, and mixtures thereof. Furthermore, a proprietary silane surface modifier, commercially available from OSI Specialties, Crompton South Charleston, W. Va., under the trade designation "Silquest A1230" is also suitable.

The surface modification of the particles in the colloidal dispersion can be accomplished in a variety of ways. The process involves the mixture of an inorganic dispersion with surface modifying agents. Optionally, a co-solvent can be added at this point, such as, for examples, 1-methoxy-2-propanol, ethanol, isopropanol, ethylene glycol, N,N-dimethylacetamide and 1-methyl-2-pyrrolidinone. The co-solvent can enhance the solubility of the surface modifying agents as well as the surface modified particles. The mixture comprising the inorganic sol and surface modifying agents is subsequently reacted at room or an elevated temperature, with or without mixing. In one method, the mixture can be reacted at about 85° C. for about 24 hours, resulting in the surface modified sol. In another method, where metal oxides are surface modified the surface treatment of the metal oxide can preferably involve the adsorption of acidic molecules to the particle surface. The surface modification of the heavy metal oxide preferably takes place at room temperature.

The surface modification of $ZrO_2$ with silanes can be accomplished under acidic conditions or basic conditions. In one case the silanes are heated under acid conditions for a suitable period of time. At which time the dispersion is combined with aqueous ammonia (or other base). This method allows removal of the acid counter ion from the $ZrO_2$ surface as well as reaction with the silane. In another method the particles are precipitated from the dispersion and separated from the liquid phase.

A combination of surface modifying agents can be useful, wherein at least one of the agents has a functional group co-polymerizable with a hardenable resin. For example, the polymerizing group can be ethylenically unsaturated or a cyclic function subject to ring opening polymerization. An ethylenically unsaturated polymerizing group can be, for example, an acrylate or methacrylate, or vinyl group. A cyclic functional group subject to ring opening polymerization generally contains a heteroatom such as oxygen, sulfur or nitrogen, and preferably a 3-membered ring containing oxygen such as an epoxide.

Useful caged molecules for the nanodispersed phase include polyhedral oligomeric silsesquioxane molecules, which are cage-like hybrid molecules of silicone and oxygen. Polyhedral oligomeric silsesquioxane (POSS) molecules are derived from a continually evolving class of compounds closely related to silicones through both composition and a shared system of nomenclature. POSS molecules have two unique features (1) the chemical composition is a hybrid, intermediate ($RSiO_{1.5}$) between that of silica ($SiO_2$) and silicone ($R_2SiO$), and (2) the molecules are physically large with respect to polymer dimensions and nearly equivalent in size to most polymer segments and coils. Consequently, POSS molecules can be thought of as the smallest particles (about 1-1.5 nm) of silica possible. However unlike silica or modified clays, each POSS molecule contains covalently bonded reactive functionalities suitable for polymerization or grafting POSS monomers to polymer chains. In addition, POSS acrylate and methacrylate monomers are suitable for ultraviolet (UV) curing. High functionality POSS acrylates and methacrylates (for example, MA0735 and MA0736) are miscible with most of the UV-curable acrylic and urethane acrylic monomers or oligomers to form mechanically durable hardcoat in which POSS molecules form nano-phases uniformly dispersed in the organic coating matrix.

Carbon can also be used in the nanodispersed phase in the form of graphite, carbon nanotubes, bulky balls, or carbon black such as described in U.S. Pat. No. 7,368,161 (McGurran et al.).

Additional materials that can be used in the nanodispersed phase include Irgastat™ P18 (available from Ciba Corporation, Tarrytown, N.Y.) and Ampacet LR-92967 (available from Ampacet Corporation, Tarrytown, N.Y.).

The dispersed phase is typically present in the matrix at concentrations between about 1 weight % and about 50 weight %; preferably between about 5 weight % and about 25 weight %.

The nanostructured articles of the invention have a nanostructured anisotropic surface. The nanostructured anisotropic surface typically comprises nanofeatures having a height to width ratio of about 2:1 or greater; preferably about 5:1 or greater. In some embodiments, the height to width ratio is even 50:1 or greater, 100:1 or greater, or 200:1 or greater. The nanostructured anisotropic surface can comprise nanofeatures such as, for example, nano-pillars or nano-columns, or continuous nano-walls comprising nano-pillars or nano-columns. Preferably, the nanofeatures have steep side walls that are roughly perpendicular to the substrate. In some embodiments, the majority of the nanofeatures are capped with dispersed phase material. The concentration of the dispersed phase at the surface (versus in the interior of the matrix) can be between about 5 weight % and about 90 weight %; preferably between about 10 weight % and about 75 weight %. In some embodiments, the concentration of the dispersed phase is higher at the surface of the matrix than within the matrix.

In some embodiments the matrix may comprise materials for static dissipation in order to minimize attraction of dirt and particulate and thus maintain surface quality. Suitable materials for static dissipation include, for example, Stat-Rite™ polymers such X-5091, M-809, S-5530, S-400, S-403, and S-680 (available from Lubrizol, Wickliffe, Ohio); 3,4-polyethylenedioxythiophene-polystyrenesulfonate (PEDOT/PSS) (available from H.C. Starck, Cincinnati, Ohio); polyanaline; polythiophene; and Pelestat™ NC6321 and NC7530 antistatic additives (available from Tomen America Inc., New York, N.Y.).

The nanostructured surface is formed by anisotropically etching the matrix. The matrix comprising the nanoscale dispersed phase can be provided, for example, as a coating on a substrate. The substrate can be, for example, a polymeric substrate, a glass substrate or window, or a function device such as an organic light emitting diode (OLED), a display, a photovoltaic device, or the like. The matrix comprising the dispersed phase can be coated on the substrate and cured using methods known in the art such as, for example, casting cure by casting drum, die coating, flow coating, or dip coating The coating can be prepared in any desired thickness greater than about 1 micron or preferably greater than about 4 microns. In addition the coating can be cured by UV, electron beam, or heat. Alternatively, the matrix comprising the dispersed phase may be the article itself.

In some embodiments, the surface of the matrix comprising the nanoscale dispersed phase may be microstructured. For example, a substrate with a v-groove microstructured surface can be coated with polymerizable matrix materials comprising a nanodispersed phase and treated by plasma etching to form nanostructures on v-groove microstructured surface. Alternatively, a microstructured article such as Fresnel lens or a microstructured article comprising microreplicated posts or columns comprising nanodispersed phases can be also treated by plasma etching to form nanostructures on microstructures.

The matrix is anisotropically etched using chemically reactive plasma. The RIE process, for example, involves generating plasma under vacuum by an electromagnetic field. High energy ions from the plasma attack or etch away the matrix material.

A typical RIE system consists of a vacuum chamber with two parallel electrodes, the "powered electrode" (or "sample carrier electrode") and the counter-electrode, that create an electric field that accelerates ions toward. The powered electrode is situated in the bottom portion of the chamber and is electrically isolated from the rest of the chamber. The article or sample to be nanostructured is placed on the powered electrode. Reactive gas species can be added to the chamber, for example, through small inlets in the top of the chamber and can exit to the vacuum pump system at the bottom of the chamber. Plasma is formed in the system by applying a RF electromagnetic field to the powered electrode. The field is typically produced using a 13.56 MHz oscillator, although other RF sources and frequency ranges may be used. The gas molecules are broken and can become ionized in the plasma and accelerated toward the powered electrode to etch the sample. The large voltage difference causes the ions to be directed toward the powered electrode where they collide with the sample to be etched. Due to the mostly vertical delivery of the ions, the etch profile of the sample is substantially anisotropic. Preferably, the powered electrode is smaller than the counter-electrode creating a large voltage potential across the ion sheath adjacent the powered electrode. Preferably, the etching is to a depth greater than about 100 nm.

The process pressure is typically maintained at below about 20 mTorr (preferably, below about 10 mTorr) but greater than about 1 mTorr. This pressure range is very conducive for generation of the anisotropic nanostructure in a cost effective manner. When the pressure is above about 20 mTorr, the etching process becomes more isotropic because of the collisional quenching of the ion energy. Similarly, when the pressure goes below about 1 mTorr, the etching rate becomes very low because of the decrease in number density of the reactive species. Also, the gas pumping requirements become very high.

The power density of the RF power of the etching process is preferably in the range of about 0.1 to about 1.0 watts/cm$^3$ (preferably, about 0.2 to about 0.3 watts/cm$^3$).

The type and amount of gas utilized will depend upon the matrix material to be etched. The reactive gas species need to selectively etch the matrix material rather than the dispersed phase. Additional gases may be used for enhancing the etching rate of hydrocarbons or for the etching of non-hydrocarbon materials. For example, fluorine containing gases such as perfluoromethane, perfluoroethane, perfluoropropane, sulfurhexafluoride, nitrogen trifluoride, and the like can be added to oxygen or introduced by themselves to etch materials such as $SiO_2$, tungsten carbide, silicon nitride, amorphous silicon, and the like. Chlorine-containing gases can likewise be added for the etching of materials such as aluminum, sulfur, boron carbide, and the like. Hydrocarbon gases such as methane can be used for the etching of materials such as gallium arsenide, gallium, indium, and the like. Inert gases, particularly heavy gases such as argon can be added to enhance the anisotropic etching process.

Advantageously, the method of the invention can also be carried out using a continuous roll-to-roll process. For example, the method of the invention can be carried out using "cylindrical" RIE. Cylindrical RIE utilizes a rotating cylindrical electrode to provide anisotropically etched nanostructures on the surface of the articles of the invention.

In general, cylindrical RIE for making the nanostructured articles of the invention can be described as follows. A rotatable cylindrical electrode ("drum electrode") powered by radio-frequency (RF) and a grounded counter-electrode are provided inside a vacuum vessel. The counter-electrode can comprise the vacuum vessel itself. Gas comprising an etchant is fed into the vacuum vessel, and plasma is ignited and sustained between the drum electrode and the grounded counter-electrode. The conditions are selected so that sufficient ion bombardment is directed perpendicular to the circumference of the drum. A continuous article comprising the matrix containing the nanodispersed phase can then be wrapped around the circumference of the drum and the matrix can be etched in the direction normal to the plane of the article. The matrix can be in the form of a coating on an article such as, for example, on a film or web, or the matrix can be the article itself. The exposure time of the article can be controlled to obtain a predetermined etch depth of the resulting nanostructure. The process can be carried out at an operating pressure of approximately 10 mTorr.

Figure 2:
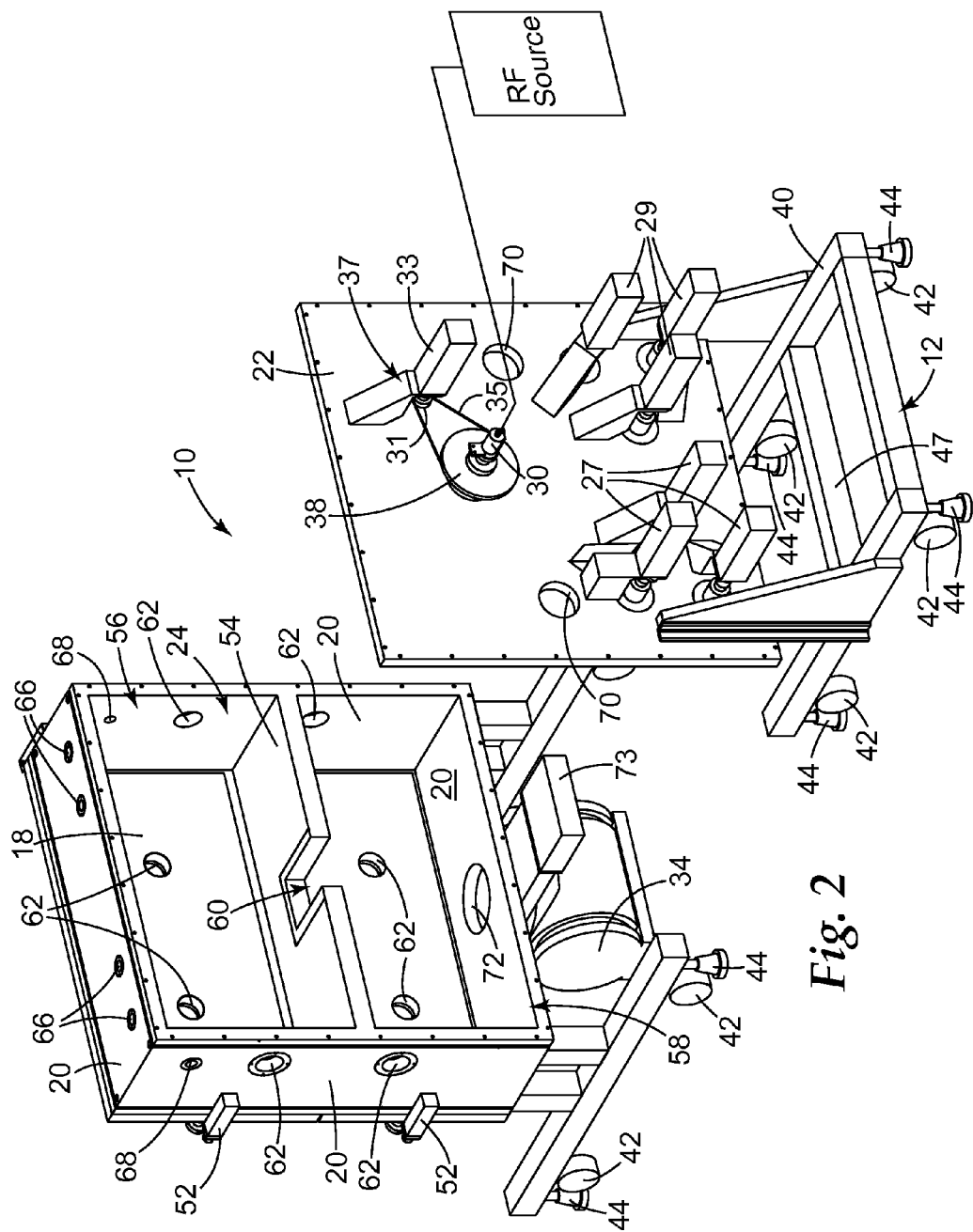
FIG. 2 is a second fragmentary perspective view of the apparatus of FIG. 1 taken from a different vantage point.

FIGS. 1 and 2 illustrate a cylindrical RIE apparatus that is useful for the methods of the invention. A common element for plasma creation and ion acceleration is generally indicated as 10. This RIE apparatus 10 includes a support structure 12, a housing 14 including a front panel 16 of one or more doors 18, side walls 20 and a back plate 22 defining an inner chamber 24 therein divided into one or more compartments, a drum 26 rotatably affixed within the chamber, a plurality of reel mechanisms rotatably affixed within the chamber and referred to generally as 28, drive mechanism 37 for rotatably driving drum 26, idler rollers 32 rotatably affixed within the chamber, and vacuum pump 34 fluidly connected to the chamber.

Support structure 12 is any means known in the art for supporting housing 14 in a desired configuration, a vertically upright manner in the present case. As shown in FIGS. 1 and 2, housing 14 can be a two-part housing as described below in more detail. In this embodiment, support structure 12 includes cross supports 40 attached to each side of the two-part housing for supporting apparatus 10. Specifically, cross supports 40 include both wheels 42 and adjustable feet 44 for moving and supporting, respectively, apparatus 10. In the embodiment shown in FIGS. 1 and 2, cross supports 40 are attached to each side of housing 14 through attachment supports 46. Specifically, cross supports 40 are connected to one of side walls 20, namely the bottom side wall, via attachment supports 46, while cross supports 40 on the other side of housing 14 are connected to back plate 22 by attachment supports 46. An additional crossbar 47 is supplied between cross supports 40 on the right-hand side of apparatus 10 as shown in FIG. 1. This can provide additional structural reinforcement.

Housing 14 can be any means of providing a controlled environment that is capable of evacuation, containment of gas introduced after evacuation, plasma creation from the gas, ion acceleration, and etching. In the embodiment shown in FIGS. 1 and 2, housing 14 has outer walls that include front panel 16, four side walls 20, and a back plate 22. The outer walls define a box with a hollow interior, denoted as chamber 24. Side walls 20 and back plate 22 are fastened together, in any manner known in the art, to rigidly secure side walls 20 and back plate 22 to one another in a manner sufficient to allow for evacuation of chamber 24, containment of a fluid for plasma creation, plasma creation, ion acceleration, and etching. Front panel 16 is not fixedly secured so as to provide access to chamber 24 to load and unload substrate materials and to perform maintenance. Front panel 16 is divided into two plates connected via hinges 50 (or an equivalent connection means) to one of side walls 20 to define a pair of doors 18. These doors seal to the edge of side walls 20, preferably through the use of a vacuum seal (for example, an O-ring). Locking mechanisms 52 selectively secure doors 18 to side walls 20 and can be any mechanism capable of securing doors 18 to walls 20 in a manner allowing for evacuation of chamber 24, storage of a fluid for plasma creation, plasma creation, ion acceleration, and etching.

In one embodiment, chamber 24 is divided by a divider wall 54 into two compartments 56 and 58. A passage or hole 60 in wall 54 provides for passage of fluids or substrate between compartments. Alternatively, the chamber can be only one compartment or three or more compartments. Preferably, the chamber is only one compartment.

Housing 14 includes a plurality of view ports 62 with high pressure, clear polymeric plates 64 sealably covering ports 62 to allow for viewing of the etching process occurring therein. Housing 14 also includes a plurality of sensor ports 66 in which various sensors (for example, temperature, pressure, etc.) can be secured. Housing 14 further includes inlet ports 68 providing for conduit connection through which fluid can be introduced into chamber 24 as needed. Housing 14 also includes pump ports 70 and 72 that allow gases and liquids to be pumped or otherwise evacuated from chamber 24.

Pump 34 is shown suspended from one of sides 20, preferably the bottom (as shown in FIG. 2). Pump 34 can be, for example, a turbo-molecular pump fluidly connected to the controlled environment within housing 14. Other pumps, such as diffusion pumps or cryopumps, can be used to evacuate lower chamber 58 and to maintain operating pressure therein. The process pressure during the etching step is preferably chosen to be between about 1 mTorr and about 20 mTorr to provide anisotropic etching. Sliding valve 73 is positioned along this fluid connection and can selectively intersect or block fluid communication between pump 34 and the interior of housing 14. Sliding valve 73 is movable over pump port 62 so that pump port 62 can be fully open, partially open, or closed with respect to fluid communication with pump 34.

Drum 26 preferably is a cylindrical electrode 80 with an annular surface 82 and two planar end surfaces 84. The electrode can be made of any electrically conductive material and preferably is a metal such as, for example, aluminum, copper, steel, stainless steel, silver, chromium or an alloy of any one or more of the foregoing. Preferably, the electrode is aluminum, because of the ease of fabrication, low sputter yield, and low costs.

Drum 26 is further constructed to include non-coated, conductive regions that allow an electric field to permeate outward as well as non-conductive, insulative regions for preventing electric field permeation and thus for limiting film coating to the non-insulated or conductive portions of the electrode. The electrically non-conductive material typically is an insulator, such as a polymer (for example, polytetrafluoroethylene). Various embodiments that fulfill this electrically non-conductive purpose so as to provide only a small channel, typically the width of the substrate to be coated, as a conductive area can be envisioned by one of ordinary skill in the art.

FIG. 1 shows an embodiment of drum 26 where annular surface 82 and end surfaces 84 of drum 26 are coated with an electrically non-conductive or insulative material, except for annular channel 90 in annular surface 82 which remains uncoated and thus electrically conductive. In addition, a pair of dark space shields 86 and 88 cover the insulative material on annular surface 82, and in some embodiments cover end surfaces 84. The insulative material limits the surface area of the electrode along which plasma creation and negative biasing may occur. However, since the insulative materials sometimes can become fouled by the ion bombardment, dark space shields 86 and 88 can cover part or all of the insulated material. These dark space shields may be made from a metal such as aluminum but do not act as conductive agents because they are separated from the electrode by means of an insulating material (not shown). This allows confinement of the plasma to the electrode area.

Figure 3:
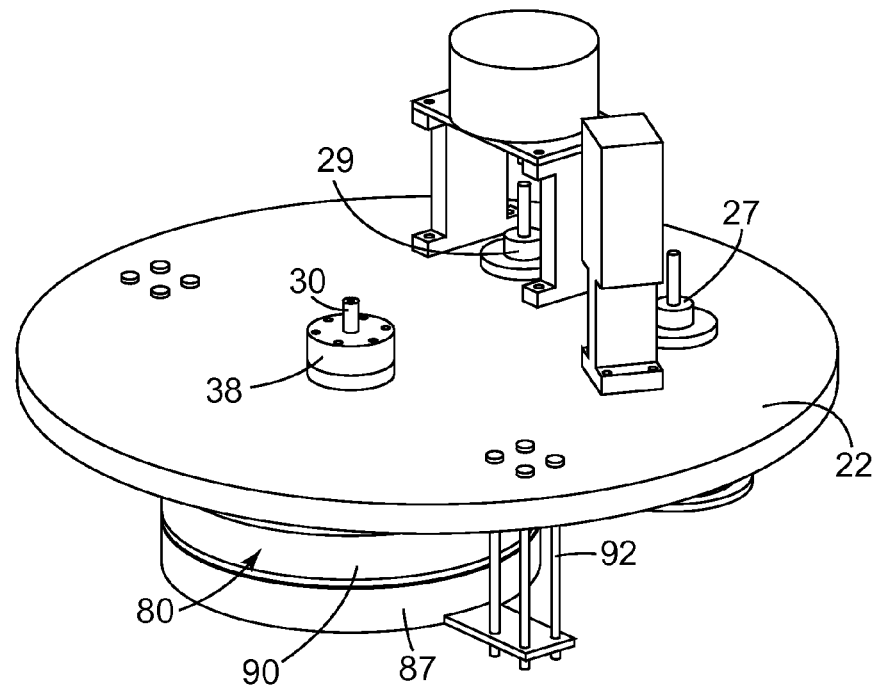
FIG. 3 is a fragmentary perspective view of another embodiment of the coating apparatus removed from its gas containing chamber.
Figure 4:
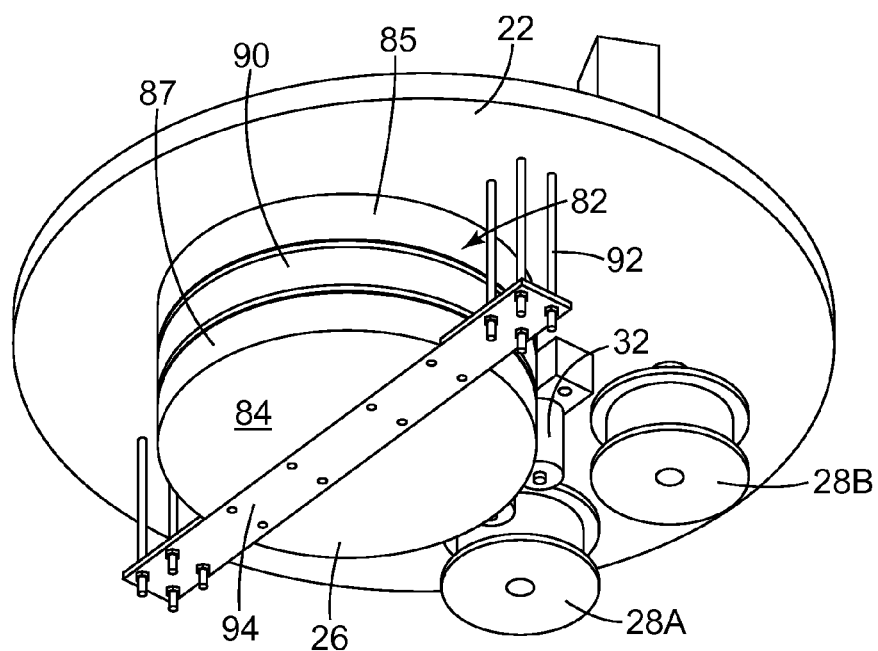
FIG. 4 is a second perspective view of the apparatus of FIG. 3 taken from a different vantage point.

Another embodiment of drum 26 is shown in FIGS. 3 and 4 where drum 26 includes a pair of insulative rings 85 and 87 affixed to annular surface 82 of drum 26. In some embodiments, insulative ring 87 is a cap which acts to also cover end surface 84. Bolts 92 secure support means 94, embodied as a flat plate or strap, to back plate 22. Bolts 92 and support means 94 can assist in supporting the various parts of drum 26. The pair of insulative rings 85 and 87, once affixed to annular surface 82, define an exposed electrode portion embodied as channel 90.

In any case, electrode 80 is covered in some manner by an insulative material in all areas except where the substrate contacts the electrode (that is, touching or within the plasma dark space limit of the electrode (for example, about 3 mm)). This defines an exposed electrode portion that can be in intimate contact with the substrate. The remainder of the electrode is covered by an insulative material. When the electrode is powered and the electrode becomes negatively biased with respect to the resultant plasma, this relatively thick insulative material prevents etching on the surfaces it covers. As a result, etching is limited to the uncovered area (that is, that which is not covered with insulative material, channel 90), which preferably is covered by relatively thin substrate material.

Referring to FIGS. 1 and 2, drum 26 is rotatably affixed to back plate 22 through a ferrofluidic feedthrough and rotary union 38 (or an equivalent mechanism) affixed within a hole in back plate 22. The ferrofluidic feedthrough and rotary union provide separate fluid and electrical connection from a standard coolant fluid conduit and electrical wire to hollow coolant passages and the conductive electrode, respectively, of rotatable drum 26 during rotation while retaining a vacuum seal. The rotary union also supplies the necessary force to rotate the drum, which force is supplied from any drive means such as a brushless DC servo motor. However, connection of drum 26 to back plate 22 and the conduit and wire may be performed by any means capable of supplying such a connection and is not limited to a ferrofluidic feedthrough and a rotary union. One example of such a ferrofluidic feedthrough and rotary union is a two-inch (about 5 cm) inner diameter hollow shaft feedthrough made by Ferrofluidics Co. (Nashua, N.H.).

Drum 26 is rotatably driven by drive assembly 37, which can be any mechanical and/or electrical system capable of translating rotational motion to drum 26. In the embodiment shown in FIG. 2, drive assembly 37 includes motor 33 with a drive shaft terminating in drive pulley 31 that is mechanically connected to a driven pulley 39 rigidly connected to drum 26. Belt 35 (or equivalent structure) translates rotational motion from drive pulley 31 to driven pulley 39.

The plurality of reel mechanisms 28 are rotatably affixed to back plate 22. The plurality of reel mechanisms 28 includes a substrate reel mechanism with a pair of substrate spools 28A and 28B, and, in some embodiments, also can include a spacing web reel mechanism with a pair of spacing web spools 28C and 28D, and masking web reel mechanism with a pair of masking web spools 28E and 28F, where each pair includes one delivery and one take-up spool. As is apparent from FIG. 2, at least each take-up reel 28B, 28D, and 28F includes a drive mechanism 27 mechanically connected thereto such as a standard motor as described below for supplying a rotational force that selectively rotates the reel as needed during etching. In addition, each delivery reel 28A, 28C, and 28E in select embodiments includes a tensioner for supplying tautness to the webs and/or a drive mechanism 29.

Each reel mechanism includes a delivery and a take-up spool which may be in the same or a different compartment from each other, which in turn may or may not be the same compartment the electrode is in. Each spool is of a standard construction with an axial rod and a rim radially extending from each end defining a groove in which an elongated member, in this case a substrate or web, is wrapped or wound. Each spool is securably affixed to a rotatable stem sealably extending through back plate 22. In the case of spools to be driven, the stem is mechanically connected to a motor 27 (for example, a brushless DC servo motor). In the case of non-driven spools, the spool is merely coupled in a rotatable manner through a coupling 29 to back plate 22 and may include a tension mechanism to prevent slack.

RIE apparatus 10 also includes idler rollers 32 rotatably affixed within the chamber and pump 34 fluidly connected to the chamber. The idler rollers guide the substrate from the substrate spool 28A to channel 90 on drum 26 and from channel 90 to take-up substrate spool 28B. In addition, where spacing webs and masking webs are used, idler rollers 32 guide these webs and the substrate from substrate spool 28A and masking web spool 28E to channel 90 and from channel 90 to take-up substrate spool 28B and take-up masking web spool 28F, respectively.

RIE apparatus 10 further includes a temperature control system for supplying temperature controlling fluid to electrode 80 via ferrofluidic feedthrough 38. The temperature control system may be provided on apparatus 10 or alternatively may be provided from a separate system and pumped to apparatus 10 via conduits so long as the temperature control fluid is in fluid connection with passages within electrode 80. The temperature control system may heat or cool electrode 80 as is needed to supply an electrode of the proper temperature for etching. In a preferred embodiment, the temperature control system is a coolant system using a coolant such as, for example, water, ethylene glycol, chloro fluorocarbons, hydrofluoroethers, and liquefied gases (for example, liquid nitrogen).

RIE apparatus 10 also includes an evacuation pump fluidly connected to evacuation port(s) 70. This pump may be any vacuum pump, such as a Roots blower, a turbo molecular pump, a diffusion pump, or a cryopump, capable of evacuating the chamber. In addition, this pump may be assisted or backed up by a mechanical pump. The evacuation pump may be provided on apparatus 10 or alternatively may be provided as a separate system and fluidly connected to the chamber.

RIE apparatus 10 also includes a fluid feeder, preferably in the form of a mass flow controller that regulates the fluid used to create the thin film, the fluid being pumped into the chamber after evacuation thereof. The feeder may be provided on apparatus 10 or alternatively may be provided as a separate system and fluidly connected to the chamber. The feeder supplies fluid in the proper volumetric rate or mass flow rate to the chamber during etching. The etching gases can include, for example, oxygen, argon, chlorine, fluorine, carbon tetrafluoride, carbontetrachloride, perfluoromethane, perfluoroethane, perfluoropropane, nitrogen trifluoride, sulfur hexafluoride, methane, and the like. Mixtures of gases may be used advantageously to enhance the etching process.

RIE apparatus 10 also includes a power source electrically connected to electrode 80 via electrical terminal 30. The power source may be provided on apparatus 10 or alternatively may be provided on a separate system and electrically connected to the electrode via electrical terminal (as shown in FIG. 2). In any case, the power source is any power generation or transmission system capable of supplying sufficient power. (See discussion infra.)

Although a variety of power sources are possible, RF power is preferred. This is because the frequency is high enough to form a self bias on an appropriately configured powered electrode but not high enough to create standing waves in the resulting plasma. RF power is scalable for high output (wide webs or substrates, rapid web speed). When RF power is used, the negative bias on the electrode is a negative self bias, that is, no separate power source need be used to induce the negative bias on the electrode. Because RF power is preferred, the remainder of this discussion will focus exclusively thereon.

The RF power source powers electrode 80 with a frequency in the range of 0.01 to 50 MHz preferably 13.56 MHz or any whole number (for example, 1, 2, or 3) multiple thereof. This RF power as supplied to electrode 80 creates a plasma from the gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line.

Upon application of RF power to the electrode, the plasma is established. In an 15 RF plasma the powered electrode becomes negatively biased relative to the plasma. This bias is generally in the range of 500 to 1400 volts. This biasing causes ions within the plasma to accelerate toward electrode 80. Accelerating ions etch the article in contact with electrode 80 as is described in more detail below.

In operation, a full spool of substrate upon which etching is desired is inserted over the stem as spool 28A. Access to these spools is provided through lower door 18 since, in FIGS. 1 and 2, the spools are located in lower compartment 58 while etching occurs in upper compartment 56. In addition, an empty spool is fastened opposite the substrate holding spool as spool 28B so as to function as the take-up spool after etching has occurred.

If a spacer web is desired to cushion the substrate during winding or unwinding, spacer web delivery and/or take-up spool can be provided as spools 28C and 28D (although the location of the spools in the particular locations shown in the figures is not critical). Similarly, if etching is desired in a pattern or otherwise partial manner, a masking web can be positioned on an input spool as spool 28E and an empty spool is positioned as a take-up spool as spool 28F.

After all of the spools with and without substrates or webs are positioned, the substrate on which etching is to occur (and any masking web to travel therewith around the electrode) are woven or otherwise pulled through the system to the take-up reels. Spacer webs generally are not woven through the system and instead separate from the substrate just before this step and/or are provided just after this step. The substrate is specifically wrapped around electrode 80 in channel 90 thereby covering the exposed electrode portion. The substrate is sufficiently taut to remain in contact with the electrode and to move with the electrode as the electrode rotates so a length of substrate is always in contact with the electrode for etching. This allows the substrate to be etched in a continuous process from one end of a roll to the other. The substrate is in position for etching and lower door 18 is sealed closed.

Chamber 24 is evacuated to remove all air and other impurities. Once an etchant gas mixture is pumped into the evacuated chamber, the apparatus is ready to begin the process of etching. The RF power source is activated to provide an RF electric field to electrode 80. This RF electric field causes the gas to become ionized, resulting in the formation of a plasma with ions therein. This is specifically produced using a 13.56 MHz oscillator, although other RF sources and frequency ranges may be used.

Once the plasma has been created, a negative DC bias voltage is created on electrode 80 by continuing to power the electrode with RF power. This bias causes ions to accelerate toward non-insulated electrode portion 90 of electrode 80 (the remainder of the electrode is either insulated or shielded). The ions selectively etch the matrix material (versus the dispersed phase) in the length of substrate in contact with channel 90 of electrode 80 causing anisotropic etching of the matrix material of on that length of substrate.

For continuous etching, the take-up spools are driven so as to pull the substrate and any masking webs through the upper compartment 54 and over electrode 80 so that etching of the matrix occurs on any unmasked substrate portions in contact with annular channel 90. The substrate is thus pulled through the upper compartment continuously while a continuous RF field is placed on the electrode and sufficient reactive gas is present within the chamber. The result is a continuous etching on an elongated substrate, and substantially only on the substrate. Etching does not occur on the insulated portions of the electrode nor does etching occur elsewhere in the chamber. To prevent the active power fed to the plasma from being dissipated in the end plates of the cylindrical electrode, grounded dark space shields 86 and 88 can be used. Dark space shields 86 and 88 can be of any shape, size, and material that is conducive to the reduction of potential fouling. In the embodiment shown in FIGS. 1 and 2, dark space shields 86 and 88 are metal rings that fit over drum 26 and the insulation thereon. Dark space shields 86 and 88 do not bias due to the insulative material that covers drum 26 in the areas where dark space shields 86 and 88 contact drum 26. The dark space shields in this ring-like embodiment further include tabs on each end thereof extending away from drum 26 in a non-annular manner. These tabs can assist in aligning the substrate within channel 90.

Preferably, the temperature control system pumps fluid through electrode 80 throughout the process to keep the electrode at a desired temperature. Typically, this involves cooling the electrode with a coolant as described above, although heating in some cases may be desirable. In addition, since the substrate is in direct contact with the electrode, heat transfer from the plasma to the substrate is managed through this cooling system, thereby allowing the coating of temperature sensitive films such as polyethyleneterephthalate, polyethylene naphthalate, and the like.

After completion of the etching process, the spools can be removed from shafts supporting them on the wall. The substrate with the nanostructured article thereon is on spool 28B and is ready for use.

In some embodiments of the nanostructured articles of the invention, the nanostructured article comprise additional layers. For example, the article may comprise an additional fluorochemical layer to give the article improved water and/or oil repellency properties. The nanostructured surface may also be post treated (for example, with an additional plasma treatment). Plasma post treatments may include surface modification to change the chemical functional groups that might be present on the nanostructure or for the deposition of thin films that enhance the performance of the nanostructure. Surface modification can include the attachment of methyl, fluoride, hydroxyl, carbonyl, carboxyl, silanol, amine, or other functional groups. The deposited thin films can include fluorocarbons, glass-like, diamond-like, oxide, carbide, nitride, or other materials. When the surface modification treatment is applied, the density of the surface functional groups is high due to the large surface area of the anisotropically etched nanostructured surface. When amine functionality is used, biological agents such as antibodies, proteins, enzymes, and the like can be easily grafted to the amine functional groups. When silanol functionality is used, silane chemistries can be easily applied to the nanostructured surface due to the high density of silanol groups. Antimicrobial, easy-clean, and anti-fouling surface treatments that are based on silane chemistry are commercially available. Antimicrobial treatments may include quaternary ammonium compounds with silane end group. Easy-clean compounds may include fluorocarbon treatments such as perfluoropolyether silane, hexafluoropropyleneoxide (HFPO) silane, and the like. Anti-fouling treatments may include polyethyleneglycol silane. When thin films are used, these thin films may provide additional durability to the nanostructure or provide unique optical effects depending upon the refractive index of the thin film. Specific types of thin films may include diamond-like carbon (DLC), diamond-like glass (DLG), amorphous silicon, silicon nitride, plasma polymerized silicone oil, aluminum, copper, and the like.

The nanostructured articles of the invention can exhibit one or more desirable properties such as antireflective properties, light absorbing properties, antifogging properties, improved adhesion and durability.

For example, in some embodiments of the invention, the surface reflectivity of the nanostructured anisotropic surface is about 50% or less than the surface reflectivity of an untreated surface. As used herein with respect to comparison of surface properties, the term "untreated surface" means the surface of an article comprising the same matrix material and the same nanodispersed phase (as the nanostructured surface of the invention to which it is being compared) but without a nanostructured anisotropic surface.

In some embodiments of the invention, the percent reflection of the nanostructured anisotropic surface is less than about 2% (preferably, less than about 1%) as measured using the "Measurement of Average % Reflection" method described in the Example section below.

Likewise, in some embodiments of the invention, the percent transmission of the nanostructured anisotropic surface is about 2% or more than the percent transmission of an untreated surface as measured using the "Measurement of Average % Transmission" method described in the Example section below.

In other embodiments of the invention, the nanostructured anisotropic surface has a water contact angle of less than about 20° (preferably, less than about 15°; more preferably less than about 10°) as measured using the "Water Contact Angle Measurement" method described in the Example section below.

In still other embodiments of the invention, the nanostructured anisotropic surface absorbs about 2% or more light than an untreated surface.

In yet other embodiments of the invention, the nanostructured anisotropic surface has a pencil hardness greater than about 2H (preferably, greater than about 4H) as determined according to ASTM D-3363-05.

Some embodiments of the invention further comprise a layer or coating comprising, for example, ink, encapsulant, adhesive, or metal attached to the nanostructured anisotropic surface. The layer or coating can have improved adhesion to the nanostructured anisotropic surface of the invention than to an untreated surface.

The nanostructured articles of the invention are useful for numerous applications including, for example, display applications (for example, liquid crystal displays (LCD), light emitting diode (LED) displays, or plasma displays); light extraction; electromagnetic interference (EMI) shielding, ophthalmic lenses; face shielding lenses or films; window films; antireflection for construction applications, construction applications or traffic signs; and the like. The nanostructured articles of the invention are also useful for solar applications such as solar films and Fresnel lenses. They can be used as the front surface of solar thermal hot liquid/air heat panels or any solar energy absorbing device; for solar thermal absorbing surfaces having micro- or macro-columns with additional nanoscale surface structure; for the front surface of flexible solar photovoltaic cells made with amorphous silica photovoltaic cells or CIGS photovoltaic cells; and for the front surface of a film applied on top of flexible photovoltaic cells.

In another embodiment of the invention, the nanodispersed phase can be etched away using plasma to form a nanostructured (or nanoporous) surface. This method can be carried out using planar RIE or cylindrical RIE essentially as described above, but using etching selectivity to favor etching the nanodispersed phase rather than the matrix (that is, by selecting gases that etch dispersed phase material rather than the matrix material).

EXAMPLES

Objects and advantages of this invention are further illustrated by the following examples, but the particular materials and amounts thereof recited in these examples, as well as other conditions and details, should not be construed to unduly limit this invention.

Plasma Treatment

The anisotropic nanostructures of this invention were obtained by using the plasma treatment system described in U.S. Pat. No. 5,888,594 (David et al.) with some modifications. The width of the drum electrode was increased to 14.5 (36.8 cm) and the separation between the two compartments within the plasma system was removed so that all the pumping was carried out by means of the turbo-molecular pump and thus operating at a much lower operating pressure than is conventionally done with plasma processing.

Rolls of polymeric film were mounted within the chamber, the film wrapped around the drum electrode and secured to the take up roll on the opposite side of the drum. The unwind and take-up tensions were maintained at 3 pounds. The chamber door was closed and the chamber pumped down to a base pressure of $5 \times 10^{-4}$ Torr. A gas mixture of either pure oxygen or argon combined with oxygen or perfluoropropane mixed with oxygen was introduced into the chamber under various conditions described in the examples below. The operating pressure was nominally 10 mTorr. Plasma was turned on at a power of 2000 watts by applying radio frequency power to the drum and the drum rotation initiated so that the film was transported at a desired speed stated in the following examples. Alternatively, pieces of polymeric film were taped around the edges on the drum electrode. The drum was rotated at a constant speed and plasma treatment was then done with different lengths of time.

Measurement of Average % Reflection

The average % reflection (% R) of the plasma treated surface was measured using PerkinElmer Lambda 950 UV-VIS-NIR Scanning Spectrophotometer. One sample of each film was prepared by applying Yamato Black Vinyl Tape #200-38 (obtained from Yamato International Corporation, Woodhaven, Mich.) to the backside of the sample. Clear poly (methyl methacrylate) (PMMA) film of which transmission and reflection from both sides were predetermined was utilized to establish the % reflection from the black tape. The black tape was laminated to the backside of the sample using a roller to ensure there were no air bubbles trapped between the black tape and the sample. To measure the front surface total % reflection (specular and diffuse) by an integrating sphere detector, the sample was placed in the machine so that the non-tape side was against the aperture.

The % reflection was measured at an 8° incident angle and average % reflection was calculated by subtracting the % reflection of the black tape for the wavelength range of 400-800 nm.

Measurement of Average % Transmission

The average % transmission was measured with an internally built machine. The machine uses a quartz tungsten halogen (QTH) lamp powered with a stabilized source and a custom 4" (10.2 cm) Spectralon™ sphere as a light source to measure sample transmission using a D/0 geometry. There are two detectors: a Silicon CCD is used for the visible and near infrared (NIR), and an InGaAs diode array are used for the remainder of the NIR. A simple spectrograph with a Czerny-Turner optical layout and a single grating is used for light dispersal onto each detector. This allows optical transmission measurement of film samples with incident measurement angles varying between 0 degrees and 60 degrees over a wavelength range of 380 nm to 1700 nm. The transmission was measured at normal incident angle and average % transmission was calculated and reported for the wavelength range of 400-800 nm in the following examples.

Water Contact Angle Measurement

Water contact angle was measured with a static contact angle measurement device. The machine is equipped with a digital camera, automatic liquid dispensers, and sample stages allowing hands-free contact angle via automated placement of a drop of water. The drop shape is captured automatically and then analyzed via Drop Shape Analysis by a computer to determine the static contact angle.

Example 1

40 wt % of 20 nm silica particles filled acrylic coating was prepared from Nalco 2327, SR444 (pentaerythritol triacylate), A-174 (methacryloxypropyltrimethoxy silane), and Irgacure™ 184 (photoinitiator) according to the method described in U.S. Pat. No. 5,104,929 (Bilkadi). The coating formulation was then diluted with isopropyl alcohol (IPA) to form 50 wt % solution. The coating solution was then coated onto primed 2 mil PET film. The solution was syringe-pumped into a coating die, and the coating was dried by passing through an oven set at 120° C. and then cured by a UV source. The resulting cured coating was approximately 4 microns thick. The samples were treated by oxygen plasma with different treatment times (30, 60, 90, 120, 150, and 180 seconds). The average % reflection was measured and reported in Table 1. Significant reduction in reflection was obtained for Samples 2-7 and 90 seconds treatment provided the best reflection behavior.

TABLE 1

Reflection results of plasma treated samples of Example 1

| | Sample | | | | | | |
|---|---|---|---|---|---|---|---|
| | 1 | 2 | 3 | 4 | 5 | 6 | 7 |
| $O_2$ plasma treatment time (seconds) | 0 (control) | 30 | 60 | 90 | 120 | 150 | 180 |
| Average % R (400-800 nm) | 4.58 | 1.42 | 1.18 | 1.04 | 1.36 | 1.69 | 1.95 |

Example 2

SR295 (pentaerythritol tetraacrylate) (240 gm), SR238 (hexane diol diacrylate) (240 gm) and SR506 (isobornyl acrylate) (120 gm) were combined and mixed. 5 nm silica particle Nalco 2326 (400 gm) was charged to a 1 qt jar. 1-methoxy-2-propanol (450 gm), 3-(Methacryloyloxy)propyltrimethoxy silane (27.82 gm) and 5% Prostab 5128 (hindered amine nitroxide inhibitor) in water (0.23 gm) were mixed together and added to colloidal dispersion while stirring. The jar was sealed and heated to 80° C. for 16 hr. The surface modified silica dispersion (1166 gm), resin mixture (70 gm) of SR295, SR238 and SR506, and 5% Prostab in water (058 gm) were combined and mixed. The water and 1-methoxy-2-propanol were removed from the mixture via rotary evaporation. This yielded a clear composition (184.6 gm) of $SiO_2$ resin mixture. The weight percent of modified silica in the formulation was about 60 wt %. Preparation of 20 nm silica particle concentrate was done with the same procedure by replacing Nalco 2326 with Nalco 2327. The nanoparticles filled resins were diluted with the mixture of SR295, SR238, and SR506 for various concentrations of silica nanoparticles in the acrylic hardcoat formulations. The hardcoats were then applied to primed 5 mil PET film with two different particle sizes (5 nm and 20 nm) and various concentrations (10%, 20%, 40% and 50% by weight) of silica nanoparticles in the acrylic coating mixture according to Table 2. One-side plasma treatment was then done under various web speeds (10, 5, 3.3, 2.5, 1.7 and 1.3 feet/min) corresponding to different treatment times (30, 60, 90, 120, 150 and 180 seconds). The transmission spectrum of the one-side treated samples was measured and the average % transmission in the wavelength range of 400-800 nm was calculated and reported in Table 2 and corresponding transmission enhancement results are reported in Table 3 below.

TABLE 2

Transmission results of plasma treated samples of Example 2

| | | | | Ave % Transmission from 400-800 nm | | | | | | | | |
|---|---|---|---|---|---|---|---|---|---|---|---|---|
| | | | | | | | After RIE | | | | | |
| | 5 nm SiO2 | 20 nm SiO2 | before | O2 (etching time, sec) | | | | | | C3F8—O2 etching time, sec | | |
| Samples | (wt %) | (wt %) | RIE | 30 | 60 | 90 | 120 | 150 | 180 | 30 | 60 | 90 |
| 8 | 49.75 | 0 | 90.0 | 91.0 | 91.5 | 92.0 | 92.2 | 92.6 | 92.8 | 90.5 | 90.8 | 91.0 |
| 9 | 39.8 | 0 | 89.9 | 91.3 | 92.2 | 92.7 | 92.9 | 93.1 | 92.9 | 90.7 | 91.2 | 91.6 |
| 10 | 19.9 | 0 | 89.8 | 92.2 | 92.9 | 93.1 | 93.0 | 92.8 | 92.6 | 91.5 | 92.3 | 92.6 |
| 11 | 9.95 | 0 | 89.8 | 92.6 | 93.1 | 93.0 | 92.8 | 92.6 | 92.6 | 92.0 | 92.8 | 92.9 |
| 12 | 0 | 49.75 | 89.8 | 92.6 | 93.1 | 92.9 | 92.8 | 92.6 | 92.2 | 92.3 | 92.8 | 92.9 |

TABLE 2-continued

Transmission results of plasma treated samples of Example 2

| | | | | | | | | | | | | |
|---|---|---|---|---|---|---|---|---|---|---|---|---|
| 13 | 0 | 39.8 | 89.9 | 92.7 | 93.1 | 93.1 | 92.9 | 92.7 | 92.2 | 92.1 | 92.7 | 92.8 |
| 14 | 0 | 19.9 | 89.9 | 93.1 | 93.1 | 93.0 | 92.8 | 92.6 | 92.4 | 92.5 | 93.0 | 93.0 |
| 15 | 0 | 9.95 | 91.1 | 94.4 | 94.5 | 94.5 | 94.0 | 93.9 | 93.6 | 93.8 | 94.5 | 94.2 |

| | Ave % Transmission from 400-800 nm After RIE | | | | | | | | |
|---|---|---|---|---|---|---|---|---|---|
| | C3F8—O2 (etching time, sec) | | | Ar—O2 (etching time, sec) | | | | | |
| Samples | 120 | 150 | 180 | 30 | 60 | 90 | 120 | 150 | 180 |
| 8 | 91.3 | 91.6 | 91.7 | 90.8 | 91.3 | 91.9 | 92.2 | 92.6 | 92.2 |
| 9 | 91.9 | 92.2 | 92.4 | 91.1 | 92.0 | 92.7 | 92.8 | 92.9 | 93.1 |
| 10 | 92.6 | 93.1 | 93.2 | 92.3 | 92.9 | 93.0 | 92.8 | 92.8 | 92.7 |
| 11 | 92.9 | 93.2 | 93.1 | 92.8 | 93.1 | 93.0 | 92.8 | 92.7 | 92.7 |
| 12 | 93.0 | 93.1 | 93.1 | 92.4 | 93.1 | 93.0 | 92.9 | 92.6 | 92.7 |
| 13 | 92.9 | 93.1 | 93.0 | 92.5 | 93.0 | 92.9 | 93.0 | 92.5 | 92.4 |
| 14 | 93.0 | 93.1 | 92.9 | 93.0 | 93.2 | 92.8 | 92.7 | 92.6 | 92.5 |
| 15 | 94.3 | 94.3 | 94.0 | 94.7 | 94.7 | 94.3 | 94.3 | 93.7 | 93.8 |

TABLE 3

Transmission enhancement (%) achieved by various treatments of Example 2

| | | | Delta % Transmission after RIE (400-800 nm) | | | | | | | | | | | | | | | | | | |
|---|---|---|---|---|---|---|---|---|---|---|---|---|---|---|---|---|---|---|---|---|---|---|
| | 5 nm SiO2 | 20 nm SiO2 | O2 (etching time, sec) | | | | | | C3F8—O2 (etching time, sec) | | | | | | Ar—O2 (etching time, sec) | | | | | | |
| Samples | (wt %) | (wt %) | 30 | 60 | 90 | 120 | 150 | 180 | 30 | 60 | 90 | 120 | 150 | 180 | 30 | 60 | 90 | 120 | 150 | 180 |
| 8 | 49.75 | 0 | 1.0 | 1.5 | 2.0 | 2.2 | 2.6 | 2.8 | 0.5 | 0.8 | 1.0 | 1.3 | 1.6 | 1.7 | 0.8 | 1.3 | 1.9 | 2.2 | 2.6 | 2.2 |
| 9 | 39.8 | 0 | 1.4 | 2.3 | 2.8 | 3.0 | 3.2 | 3.0 | 0.8 | 1.3 | 1.7 | 2.0 | 2.3 | 2.5 | 1.2 | 2.1 | 2.8 | 2.9 | 3.0 | 3.2 |
| 10 | 19.9 | 0 | 2.4 | 3.1 | 3.3 | 3.2 | 3.0 | 2.8 | 1.7 | 2.5 | 2.8 | 2.8 | 3.3 | 3.4 | 2.5 | 3.1 | 3.2 | 3.0 | 3.0 | 2.9 |
| 11 | 9.95 | 0 | 2.8 | 3.3 | 3.2 | 3.0 | 2.8 | 2.8 | 2.2 | 3.0 | 3.1 | 3.1 | 3.4 | 3.3 | 3.0 | 3.3 | 3.2 | 3.0 | 2.9 | 2.9 |
| 12 | 0 | 49.75 | 2.8 | 3.3 | 3.1 | 3.0 | 2.8 | 2.4 | 2.5 | 3.0 | 3.1 | 3.2 | 3.3 | 3.3 | 2.6 | 3.3 | 3.2 | 3.1 | 2.8 | 2.9 |
| 13 | 0 | 39.8 | 2.8 | 3.2 | 3.2 | 3.0 | 2.8 | 2.3 | 2.2 | 2.8 | 2.9 | 3.0 | 3.2 | 3.1 | 2.6 | 3.1 | 3.0 | 3.1 | 2.6 | 2.5 |
| 14 | 0 | 19.9 | 3.2 | 3.2 | 3.1 | 2.9 | 2.7 | 2.5 | 2.6 | 3.1 | 3.1 | 3.1 | 3.2 | 3.0 | 3.1 | 3.3 | 2.9 | 2.8 | 2.7 | 2.6 |
| 15 | 0 | 9.95 | 3.3 | 3.4 | 3.4 | 2.9 | 2.8 | 2.5 | 2.7 | 3.4 | 3.1 | 3.2 | 3.2 | 2.9 | 3.6 | 3.6 | 3.2 | 3.2 | 2.6 | 2.7 |

Example 3

Coating solutions made from the blend of MA0736 POSS™ molecules (available from Hybrid Plastics Inc., Hattiesburg, Miss.), CN991 (aliphatic urethane acrylate from Sartomer, Exton, Pa.), CN2303 (alkoxylated multifunctional acrylate oligomer from Sartomer), tetrahydrofurfuryl alcohol (TFHA) and Lucirin™ TPO-L (photoinitiator, available from BASF) were applied to primed PET film and cured by UV source. The coated film was then treated with oxygen plasma for 90 seconds. The % reflection was measured and reported with the formulations and treatment conditions in Table 4.

TABLE 4

Reflection results of plasma treated samples of Example 3

| | Formulation (wt %) | | | | | O2 plasma | |
|---|---|---|---|---|---|---|---|
| Sample | CN991 | CN991/CN2303 (70:30) | THFA | MA0736 | TPO-L | treatment time (seconds) | Average % R (400-800 nm) |
| 16 | 0 | 88 | 10 | 0 | 2 | 90 | 3.37 |
| 17 | 0 | 87 | 10 | 1 | 2 | 90 | 2.89 |
| 18 | 0 | 85 | 10 | 3 | 2 | 90 | 2.65 |
| 19 | 0 | 83 | 10 | 5 | 2 | 90 | 2.03 |
| 20 | 0 | 81 | 10 | 7 | 2 | 90 | 1.44 |
| 21 | 0 | 78 | 10 | 10 | 2 | 90 | 1.01 |
| 22 | 0 | 73 | 10 | 15 | 2 | 90 | 0.9 |
| 23 | 0 | 68 | 10 | 20 | 2 | 90 | 0.73 |

Example 4

Imperm™ 103 is nylon MXD6 comprising 3 wt % nano-scale talc and commercially available from Nanocor Inc. Film sample was prepared from Imperm 103 by melt extrusion process through a slot die and then treated by Ar—O2 plasma corresponding to different treatment times (30, 60, and 90 seconds). The % reflection was then measured and reported in Table 5.

TABLE 5

Reflection results of plasma treated samples of Example 4

| | Sample | | | |
|---|---|---|---|---|
| | 24 | 25 | 26 | 27 |
| Ar—O2 plasma treatment time (seconds) | 0 (Imperm control) | 103 | 30 | 60 | 90 |
| Average % R (400-800 nm) | 5.12 | | 4.25 | 2.05 | 0.95 |

Example 5

In this example, Sample #5 in Example 1 was further treated by applying a perfluoropolyether-silane (EGC-1720 available from 3M Company) solution to the etched surface. The static contact angle and transmission for Sample #1, Sample #5, and Sample #5 treated with EGC-1720 were measured. The results are reported in Table 6 below. The contact angle to water is shown to be adjustable from below 10 degrees to above 120 degrees.

TABLE 6

Transmission and water contact test results of the samples in Example 5

| Sample | Comment | Average % transmission (400-800 nm) | H2O contact angle (degree) |
|---|---|---|---|
| 1 | PET coated with coating from Example 1 (Sample #1 in Example 1) | 90.5 | 71.8 |
| 5 | Sample #5 in Example 1 | 93.5 | 9.8 |
| 28 | Sample #5 treated with EGC-1720 | 94.1 | 122.5 |

Example 6

In this example, a substrate web containing microstructure (Brightness Enhancement Film-BEF made from 37 wt % 20 nm silica particles filled coating in US 20080050560-A1) was used to generate a nanostructure on top of the microstructure by plasma treatment. For the etching treatment, oxygen gas was used with a treatment time of 90 seconds with the flow rate, pressure and power maintained at 500 sccm, 8 mTorr and 2000 watts respectively. The percent reflection was measured. The average % reflection in the wavelength range of 400-800 nm is reduced from 2.2% to 1%, a 50% reduction in the surface reflection.

Example 7

Figure 5:
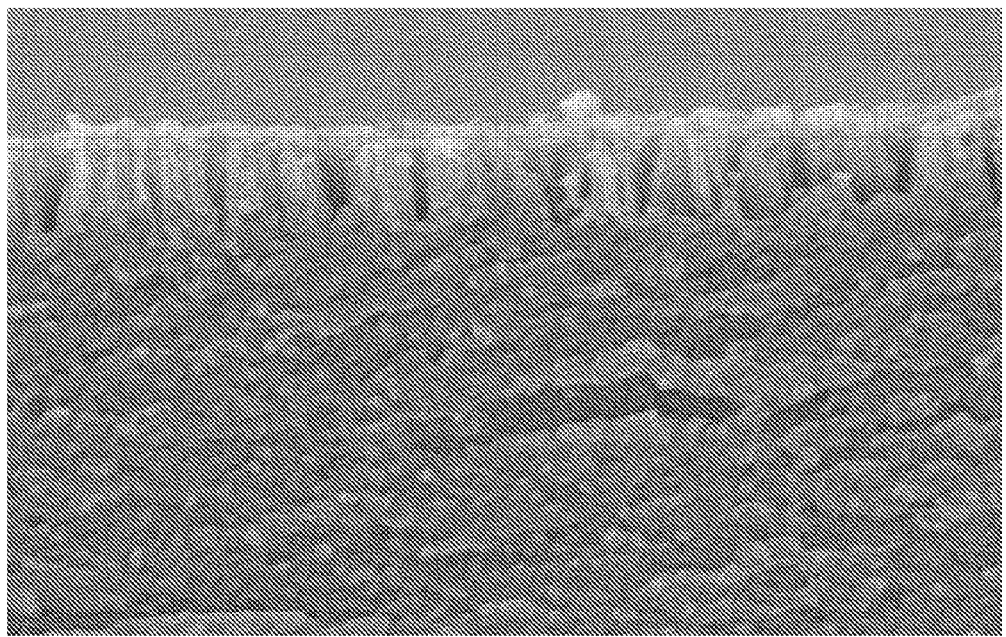
FIG. 5 is a scanning electron microscope photograph of an anisotropic nanostructured article of the invention.
Figure 6:
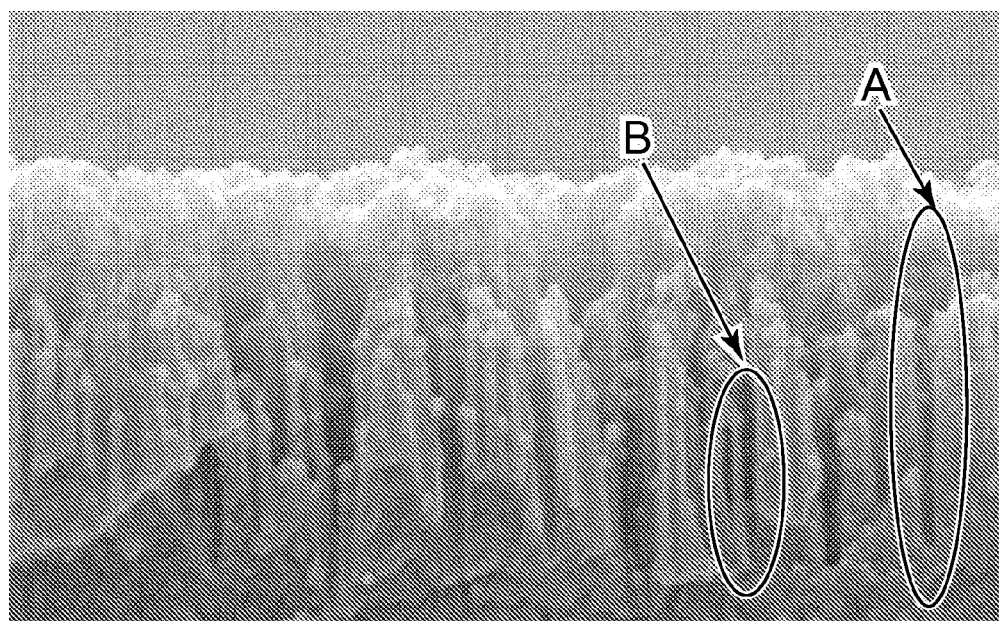
FIG. 6 is a scanning electron microscope photograph of another anisotropic nanostructure article of the invention.

Two of the plasma etched samples of Example 2 above (10 wt % concentration of 20 nm silica particles etched at 60 and 180 seconds) were characterized by cross-sectional high resolution scanning electron microscope (HRSEM). The results are depicted in FIGS. 5 (5 feet/min) and 6 (1.3 feet/min). It is clear that the etching is anisotropic in the sub 100 nm range. Several holes and pillars that are in the 10-50 nm diameter range are in the order of 500 nanometers range for depth, leading to a 5:1 aspect ratio or greater. The hole marked as "A" in FIG. 6 has a diameter of 27 nanometers and a depth of 480 nanometers while the pillar marked as "B" has a diameter of 18 nanometers and a depth of 364 nanometers. The corresponding aspect ratio of these structures approaches about 20:1.

Example 8

A flexible solar absorbing sheet was prepared with an extrusion replication process and subsequently treated with plasma etching of the structured surface. Carbon filled thermoplastic polyurethane (URC7000-TC-1 available from PolyOne Corp, Cleveland, Ohio) was melted with an extruder and formed through an extrusion sheet die onto a casting roll perforated with an array of holes distanced about 3 mm apart with depths of 0.5 cm and diameters of 2 mm. The extruder had a diameter of about 3.2 cm, a screw speed of 80 rpm, and a rising temperature profile from 100° C. to 250° C. The extrusion replication casting roll was the center roll of a 3 roll stack with a nip roll capable of pushing the carbon filled polymer melt into the casting replication tool roll at a pressure of 0.24 MPa. The extrusion replication casting process was operated at a speed of 0.61 meters/minute. Total thickness of the extrusion replicated cast sheet was 1.1 cm with 1.0 cm high posts or columns and 0.1 cm thickness of continuous base film. % Reflection of this opaque columnar structured sheet was then measured to be 3.1% with a Lambda 950 spectraphotometer. Since the opaque structured sheet had no measurable light transmission, % Absorption was calculated to be 1−% R or 96.9% absorption.

The flexible solar absorbing sheet was then treated by plasma in an $O_2$—$C_3F_8$ atmosphere for 60 seconds. % Reflection of the plasma etched opaque columnar structured sheet was measured to 1.4% with a Lambda 950 spectraphotomer demonstrating a 55% reduction in surface reflections. % Absorption of the plasma etched columnar-structured solar absorption sheet was calculated to be 98.6%.

Example 9

An article of this invention was prepared according to Example 1, Sample 5, using oxygen plasma and an etching time of 120 seconds. The adhesion of the anisotropically etched random nanostructure was measured against two different types of adhesives, a premium silicon adhesive and an "extra strength" acrylic adhesive. For comparison, an unetched sample of the hardcoated substrate as in Example 1 was used. A 180 degree peel tester was used to test the adhesion strength.

Test samples were cut into approximately 2-inch (5.1 cm) wide×6-inch (15.2 cm) long strip and two different types of tapes having the two different adhesive types were used. The silicone adhesive tape is a 1-inch (2.5 cm) wide Scotch™ Tape No. 8403 with a silicone adhesive and the acrylic adhesive tape is an "Extra Strength" ¾-inch (1.9 cm) wide Scotch™ Crystal Clear tape having a product number 34-8505-5627-4, available from 3M Company (St. Paul, Minn.).

The adhesive tape was attached to the test samples by rolling a 4-inch (10.2 cm) diameter roller having a weight of 450 grams onto the tape/sample sandwich. Peel measurements were taken at a speed of 12 inches/min (30.5 cm/min) over a test length of 0.5 inches (1.3 cm) and the average peel value over this distance was measured. Six different measurements were made for each type of sample/adhesive combination and summarized in Table 7. The average and standard deviation of the six measurements are also shown in this table.

TABLE 7

Peel Measurements from Example 9

| Sample No. | Silicone Adhesive Peel Strength, Ave lb/in | Acrylic Adhesive Peel Strength, lb/in |
|---|---|---|
| Control-1 | 1.29 | 1.133333 |
| Control-2 | 1.31 | 1.2 |
| Control-3 | 1.32 | 1.24 |
| Control-4 | 1.22 | 1.173333 |
| Control-5 | 1.34 | 1.2 |
| Control-6 | 1.39 | 1.186667 |
| Control Ave | 1.311667 | 1.188889 |
| Control Std. Dev | 0.051451 | 0.032126 |
| Etched-1 | 1.95 | 2.626667 |
| Etched-2 | 2.04 | 2.72 |
| Etched-3 | 2 | 2.786667 |
| Etched-4 | 1.95 | 2.653333 |
| Etched-5 | 1.9 | 2.76 |
| Etched-6 | 1.94 | 2.786667 |
| Etched Ave | 1.963333 | 2.722222 |
| Etched Std. Dev | 0.044969 | 0.062736 |

Example 10

Pencil hardness test according to ASTM D-3363-05 test method was utilized to evaluate the surface hardness of Sample 4 in Example 1. A complete set of pencil gradings starts with the hardest—9H, 8H, 7H, 6H, 5H, 4H, 3H, 2H, F, HB, B, 2B, 3B, 4B, 5B, 6B, 7B, 8B, and 9B (the latter is the softest pencil). To perform the test, a pencil is used to make a line about one inch long on the sample. If the pencil leaves a visible scratch on the surface, then take the next soft pencil to repeat the test. The number of the first pencil that does not leave a visible mark is considered the "pencil hardness" rating of the surface. Sample 4 in Example 1 was found to be 4H by this test method The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A nanostructured article comprising:
   a matrix and a nanoscale dispersed phase, the nanostructured article comprising a random nanostructured anisotropic surface comprising nanoscale features having a height to width ratio of 5:1 or greater, wherein
   the nanostructured article has a length along an x-direction, a width along a y-direction, and a thickness along a z-direction,
   the nanoscale features comprise nano-pillars generally in the z-direction,
   a majority of the nano-pillars are capped with physically exposed nanoscale dispersed phase from the nanoscale phase in the matrix,
   the article comprises a microstructured surface and a layer disposed on the microstructured surface such that the layer conforms to the microstructured surface at an interface between the layer and the microstructured surface, the layer comprising the nanostructured anisotropic surface, and
   a surface reflectivity of the nanostructured article from the nanostructured anisotropic surface is not greater than 50% of a surface reflectivity of a corresponding nanostructured article that is free of the nanostructured anisotropic surface comprising the nano-pillars capped with the physically exposed nanoscale dispersed phase.

2. The article of claim 1, wherein the matrix comprises a polymer.

3. The article of claim 1, wherein the matrix comprises an inorganic material.

4. The article of claim 1, wherein the matrix comprises an alloy or a solid solution.

5. The article of claim 1, wherein the dispersed phase comprises nanoparticles, nanotubes, or nanofibers.

6. The article of claim 1, wherein the dispersed phase comprises caged molecules, hyperbranched molecules, micelles, or reverse micelles.

7. The article of claim 1, wherein a percent transmission of the nanostructured anisotropic surface is about 2% or more than a percent transmission of an untreated surface.

8. The article of claim 1, wherein the nanostructured anisotropic surface has a water contact angle of less than about 20°.

9. The article of claim 1, wherein the nanostructured anisotropic surface absorbs about 2% or more light than an untreated surface.

10. The article of claim 1, wherein the concentration of the dispersed phase within the matrix is between about 1 weight % and about 50 weight %.

11. The article of claim 1, wherein the nano-pillars capped with the physically exposed nanoscale dispersed phase are directly formable via anisotropically etching the layer.

12. A nanostructured article comprising:
   a matrix and a nanoscale dispersed phase, the nanostructured article comprising a random nanostructured anisotropic surface comprising nanoscale features having a height to width ratio of 5:1 or greater, wherein
   the nanostructured article has a length along an x-direction, a width along a y-direction, and a thickness along a z-direction,
   the nanoscale features comprise nano-pillars generally in the z-direction,
   a majority of the nano-pillars are capped with physically exposed nanoscale dispersed phase from the nanoscale phase in the matrix, and
   the nano-pillars capped with the physically exposed nanoscale dispersed phase are directly formable via anisotropically etching a coating comprising the nanoscale dispersed phase dispersed in the matrix such that the nanoscale dispersed phase is partially embedded in the nano-pillars.

13. The nanostructured article of claim 12, wherein the coating is disposed on a substrate.

14. The nanostructured article of claim 13, wherein the substrate is a display.

* * * * *